(12) United States Patent
Sung et al.

(10) Patent No.: US 12,721,149 B2
(45) Date of Patent: Aug. 25, 2026

(54) NONVOLATILE MEMORY DEVICE AND SYSTEM COMPRISING THE SAME

(71) Applicant: SAMSUNG ELECTRONICS CO., LTD., Suwon-si (KR)

(72) Inventors: Jung Tae Sung, Suwon-si (KR); Yun Sun Jang, Suwon-si (KR); Moo Rym Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 582 days.

(21) Appl. No.: 18/117,623

(22) Filed: Mar. 6, 2023

(65) Prior Publication Data

US 2023/0369212 A1 Nov. 16, 2023

(30) Foreign Application Priority Data

May 13, 2022 (KR) ........................ 10-2022-0058960

(51) Int. Cl.
*H10W 20/41* (2026.01)
*H10B 41/10* (2023.01)
(Continued)

(52) U.S. Cl.
CPC .......... *H10W 20/435* (2026.01); *H10B 41/10* (2023.02); *H10B 41/27* (2023.02);
(Continued)

(58) Field of Classification Search
CPC ........ H10B 41/00–70; H10B 43/00–50; H01L 23/5283
See application file for complete search history.

(56) References Cited

U.S. PATENT DOCUMENTS

| | | | |
|---|---|---|---|
| 10,804,202 | B2 | 10/2020 | Nishida |
| 10,930,661 | B2 | 2/2021 | Chen et al. |

(Continued)

FOREIGN PATENT DOCUMENTS

| | | | |
|---|---|---|---|
| KR | 10-2020-0052497 | A | 5/2020 |
| KR | 10-2022-0042702 | A | 4/2022 |

OTHER PUBLICATIONS

Extended European Search Report dated Oct. 30, 2023 issued by the European Patent Office in Counterpart European Application No. 23 169 926.5.

(Continued)

*Primary Examiner* — Christine S. Kim
*Assistant Examiner* — Tyler J Wiegand
(74) *Attorney, Agent, or Firm* — Sughrue Mion, PLLC

(57) ABSTRACT

A nonvolatile memory device includes a plurality of metal lines extending in a first direction and stacked in a second direction crossing the first direction, a plurality of cell structures passing through the plurality of metal lines and extending in the second direction, a plurality of extension regions, a plate common source line contact connected with a common source line, extending in the first direction, and formed in least two of the plurality of extension regions that are not formed with the plurality of cell structures, and
(Continued)

input/output metal contacts connected with an external connection pad, extending in the first direction, and formed with at least two of the plurality of extension regions that are not formed with the plate common source line contact.

17 Claims, 9 Drawing Sheets

(51) Int. Cl.

| | |
|---|---|
| ***H10B 41/27*** | (2023.01) |
| ***H10B 41/35*** | (2023.01) |
| ***H10B 41/40*** | (2023.01) |
| ***H10B 43/10*** | (2023.01) |
| ***H10B 43/27*** | (2023.01) |
| ***H10B 43/35*** | (2023.01) |
| ***H10B 43/40*** | (2023.01) |

(52) U.S. Cl.

CPC ............. *H10B 41/35* (2023.02); *H10B 41/40* (2023.02); *H10B 43/10* (2023.02); *H10B 43/27* (2023.02); *H10B 43/35* (2023.02); *H10B 43/40* (2023.02)

(56) References Cited

U.S. PATENT DOCUMENTS

| | | | | |
|---|---|---|---|---|
| 10,937,766 | B2 | 3/2021 | Liu | |
| 11,127,717 | B2 | 9/2021 | Sanuki | |
| 11,195,781 | B2 | 12/2021 | Okina et al. | |
| 2020/0350287 | A1* | 11/2020 | Liu | H10B 61/10 |
| 2020/0402579 | A1 | 12/2020 | Park | |
| 2020/0411106 | A1* | 12/2020 | Nam | H10B 43/27 |
| 2021/0065799 | A1* | 3/2021 | Kim | H10B 43/40 |
| 2021/0125928 | A1* | 4/2021 | Kim | H01L 23/535 |
| 2022/0102306 | A1 | 3/2022 | Ahn et al. | |
| 2022/0115344 | A1 | 4/2022 | Kim et al. | |

OTHER PUBLICATIONS

Communication dated Nov. 10, 2023 issued by the European Patent Office in counterpart European Application No. 23 169 926.5.

Communication dated Jan. 12, 2026 issued by the Korean Ministry of Intellectual Property in Korean Patent Application No. 10-2022-0058960.

* cited by examiner

FIG. 4

400
330
301 310 320 331 332 333 334 335 336 337 338 CH 350c 360c 371c 392 252 251 215 210 201
I' II'
BLBA WLBA PA
340
341 342 343 344 345 346 347
220c 272c 393 230c 240c 271c 372c
394 271b 272b 220b 230b 240b
205 203 230a 240a 220a
303 315 380 350b 360b 371b 372b 350a 360a 371a 372a 272a 273a 271a
CELL PERI I II
X Y Z 2500
2210
2400
2100
I'
2130
2003
I
3210
3220
2200
2300
2003a
2003
2003b
2005
2001
2000
2002
2004
2006

NONVOLATILE MEMORY DEVICE AND SYSTEM COMPRISING THE SAME

CROSS-REFERENCE TO RELATED APPLICATION

This application is based on and claims priority to Korean Patent Application No. 10-2022-00058960, filed on May 13, 2022 in the Korean Intellectual Property Office, the disclosure of which is incorporated by reference herein in its entirety.

BACKGROUND

1. Field

One or more example embodiments of the disclosure relates to a nonvolatile memory device and a system including the same.

2. Description of Related Art

An ongoing demand exists for a nonvolatile memory device capable of storing high-capacity data in a nonvolatile memory system requiring data storage. The density of nonvolatile memory devices needs to be increased to meet the high performance and low price demanded by consumers while increasing data storage capacity. A two-dimensional (2D) or planar nonvolatile memory device has its degree of integration mainly determined by an area occupied by a unit memory cell, which renders the degree of integration to be significantly affected by the level of micro patterning technology. However, pattern micronizing requires ultra-expensive equipment which has made 2D semiconductor devices available with increased degrees of integration, yet limited production potential. Accordingly, proposals have been made for providing three-dimensional nonvolatile memory devices including three-dimensionally arranged memory cells.

SUMMARY

Provided are a nonvolatile memory device produced with a finally reduced chip size by efficiently utilizing space and a system including the same nonvolatile memory device.

Provided is a method of manufacturing a nonvolatile memory device with improved process efficiency by establishing an extension region channel structure that is a formation in an extension region, and forming a plate common source line contact, and an input/output metal contact.

Additional aspects will be set forth in part in the description which follows and, in part, will be apparent from the description, or may be learned by practice of the presented embodiments.

According to an aspect of an example embodiment, a nonvolatile memory device may include a plurality of metal lines stacked in a first direction, a plurality of cell structures connected with a bit line, the plurality of cell structures extending in the first direction and passing through the plurality of metal lines, a plurality of extension regions in the plurality of metal lines, a plate common source line contact connected with a common source line, extending in the first direction, and formed in least two of the plurality of extension regions that are not formed with the plurality of cell structures, and input/output metal contacts connected with an external connection pad, extending in the first direction, and formed with at least two of the plurality of extension regions that are not formed with the plate common source line contact.

According to an aspect of an example embodiment, a nonvolatile memory device may include a plurality of metal lines extending in a first direction and stacked in a second direction crossing the first direction, a plurality of cell structures passing through the plurality of metal lines and extending in the second direction, a plurality of extension regions, a plate common source line contact spaced apart from the plurality of cell structures in the first direction, extending in the second direction, formed in at least two of the plurality of extension regions that are not formed with the plurality of cell structures, and connected with a common source line, and input/output metal contacts spaced apart from the plate common source line contact in the first direction, extending in the second direction, formed in at least two of the plurality of extension regions that are not formed with the plate common source line contact, and connected with an external connection pad.

According to an aspect of an example embodiment, a nonvolatile memory system may include a nonvolatile memory device configured to store data and comprising an external connection pad, and a controller configured to control the nonvolatile memory device through the external connection pad. The nonvolatile memory device may include a plurality of metal lines extending in a first direction and stacked in a second direction crossing the first direction, a plurality of cell structures passing through the plurality of metal lines and extending in the second direction, a plurality of extension regions, a plate common source line contact spaced apart from the plurality of cell structures in the first direction, extending in the second direction, formed in at least two of the plurality of extension regions that are not formed with the plurality of cell structures, and connected with a common source line, and input/output metal contacts spaced apart from the plate common source line contact in the first direction, extending in the second direction, and formed in at least two of the plurality of extension regions that are not formed with the plate common source line contact, and connected with the external connection pad.

BRIEF DESCRIPTION OF THE DRAWINGS

The above and other aspects, features, and advantages of certain example embodiments of the present disclosure will be more apparent from the following description taken in conjunction with the accompanying drawings, in which:

FIGS. 4 and 5 are diagrams of intermediate steps of manufacturing the nonvolatile memory device of FIG. 3 according to an example embodiment;

FIGS. 8 and 9 are cross-sectional views taken along line I-I' of a nonvolatile memory package of FIG. 7 including the nonvolatile memory device according to an example embodiment.

DETAILED DESCRIPTION OF THE EMBODIMENTS

Hereinafter, embodiments of the present disclosure will be described with reference to the attached drawings.

Figure 1:
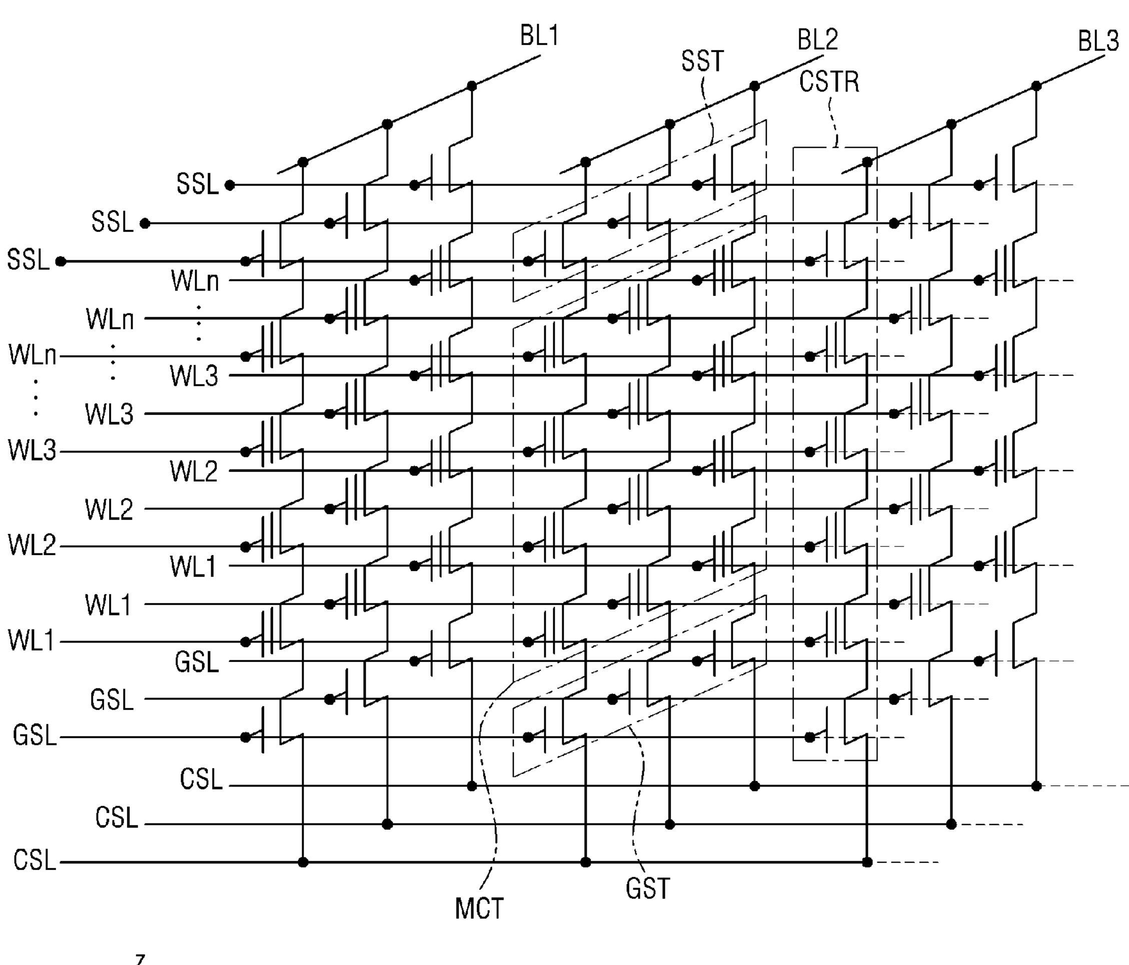
FIG. 1 is a diagram of an example nonvolatile memory device according to an example embodiment.
Figure 1:
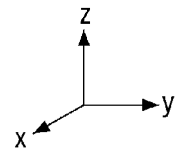

FIG. 1 is a diagram of an example nonvolatile memory device according to an example embodiment.

Referring to FIG. 1, a memory cell array of a nonvolatile memory device according to example embodiments may include common source lines CSL, a plurality of bit lines BL, and a plurality of cell strings CSTR.

The plurality of bit lines BL1 to BL3 may be two-dimensionally arranged. For example, the plurality of bit lines BL1 to BL3 may be spaced apart from each other and extend in a first direction X, respectively. In parallel to each bit line BL, a plurality of cell strings CSTR may be connected. The cell strings CSTR may be commonly connected to the common source line CSL. For example, a plurality of cell strings CSTR may be disposed between the bit lines BL and the common source line CSL. In example embodiments, the plurality of common source lines CSL may be two-dimensionally arranged. For example, the common source lines CSL may be spaced apart from each other and extend in a second direction Y, respectively. The common source lines CSL may be applied with the same voltage, or different voltages may be applied for the common source lines CSL to be separately controlled.

Each cell string CSTR may include a ground selection transistor GST connected to the common source line CSL, a string selection transistor SST connected to each of the plurality of bit lines BL1 to BL3, and a plurality of memory cell transistors MCT disposed between the ground selection transistor GST and the string selection transistor SST.

Each memory cell transistor MCT may include a data storage element. The ground selection transistor GST, the string selection transistor SST, and the memory cell transistors MCT may be connected in series.

The common source line CSL may be commonly connected to sources of the ground selection transistors GST. Additionally, disposed between the respective common source lines CSL and the respective bit lines BL1 to BL3 may be a plurality of gate electrodes (e.g., a ground selection line GSL and a plurality of word lines WL1-WLn) and a string selection line SSL.

The ground selection line GSL may be used as a gate electrode of the ground selection transistor GST, the plurality of word lines WL1-WLn may be used as gate electrodes of the memory cell transistors MCT, and the string selection line SSL may be used as a gate electrode of the string selection transistor SST.

Figure 2:
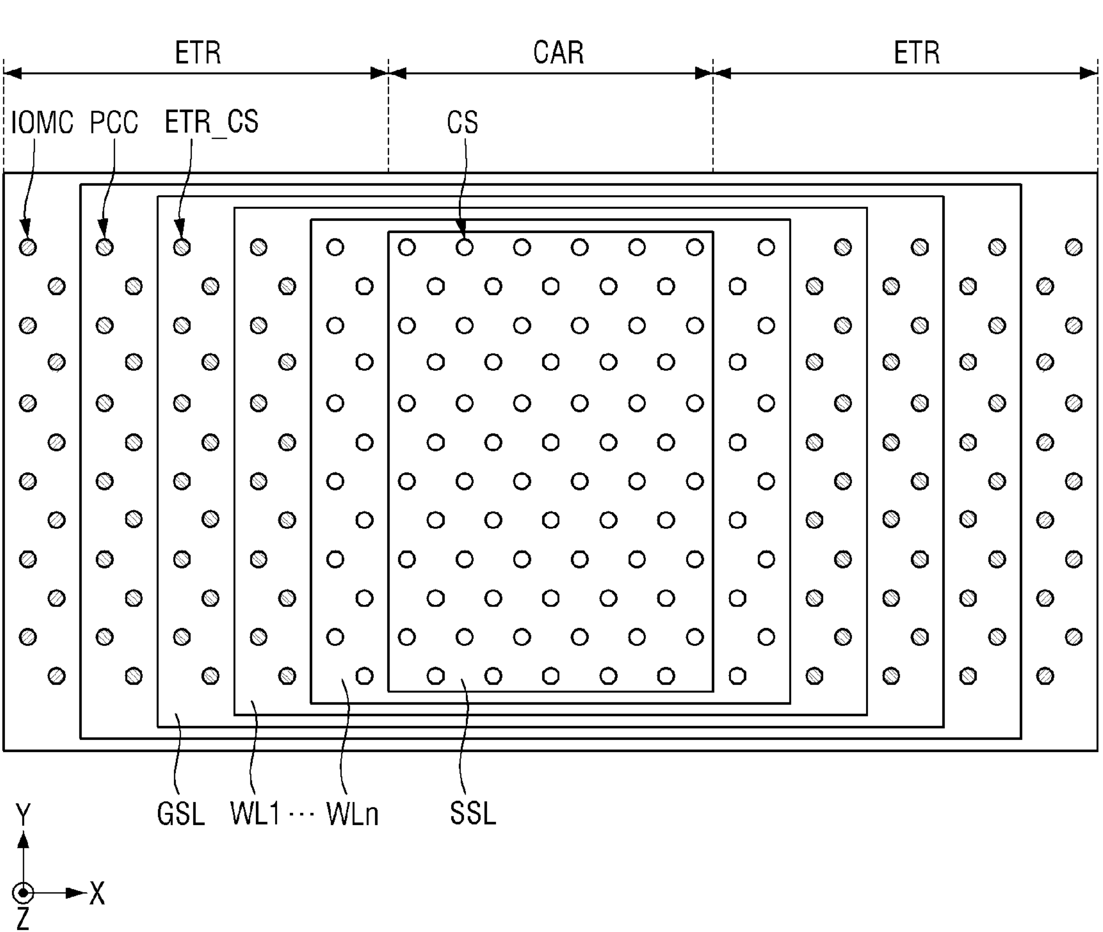
FIG. 2 is a diagram of an example nonvolatile memory device according to an example embodiment.

FIG. 2 is a diagram of an example nonvolatile memory device 1 according to an example embodiment.

Referring to FIG. 2, the nonvolatile memory device 1 may include a cell array region CAR and extension regions ETR.

The cell array area CAR may be formed with a memory cell array including a plurality of memory cells. The memory cell array may include a plurality of memory cells, a plurality of word lines WL1-WLn connected electrically and respectively to the memory cells, and although not shown, a plurality of bit lines. For example, the cell array region CAR may be formed with a mold structure, a plurality of channel structures CS, and a bit line.

For example, the plurality of channel structures CS forming the memory cell may extend in the third direction Z and pass through a plurality of metal lines (e.g., a ground selection line GSL, multiple word lines WL1 to WLn, and a string selection line SSL).

The extension regions ETR may be disposed around the cell array area CAR. The extension region ETR may include a terraced stack structure of at least some portions of respective ones of a plurality of gate electrodes (e.g., the ground selection line GSL, multiple word lines WL1-WLn, and string selection line SSL), the mold structure, and the multiple channel structures CS.

Further, the extension regions ETR may each be formed with multiple pad electrodes connected with the gate electrodes, e.g., the ground selection line GSL, multiple word lines WL1-WLn, and string selection line SSL.

Each extension region ETR of the nonvolatile memory device 1 according to example embodiments may be formed with input/output metal contacts IOMC. The input/output metal contacts IOMC may be, for example, input/output connection lines 4265 and 5265 to be described with reference to FIGS. 8 and 9.

The formation of the input/output metal contacts IOMC of the nonvolatile memory device 1 according to example embodiments in the extension regions ETR allows the limited space of the nonvolatile memory device 1 to be efficiently utilized. Additionally, the same input/output metal contacts IOMC of the nonvolatile memory device 1 according to example embodiments as formed in the extension regions ETR can result in a size reduction of a final chip product including the nonvolatile memory device 1.

The extension region ETR of the nonvolatile memory device 1 according to example embodiments may be formed with a plate common source line contact (Plate CSL Contact) PCC. The plate common source line contact PCC may be, for example, a common source line contact plug 380 to be described with reference to FIG. 3.

The formation of plate common source line contacts PCC of the nonvolatile memory device 1 according to example embodiments in the extension regions ETR allows the limited space of the nonvolatile memory device 1 to be efficiently utilized. Additionally, the same plate common source line contacts PCC of the nonvolatile memory device 1 according to example embodiments as formed in the extension regions ETR can result in a size reduction of a final chip product including the nonvolatile memory device 1.

Additionally, the manufacturing process efficiency of the nonvolatile memory device 1 can be improved by forming the plate common source line contacts PCC and the input/output metal contacts IOMC of the nonvolatile memory device 1 according to example embodiments simultaneously with the channel structures CS formed in the extension regions ETR.

Figure 3:
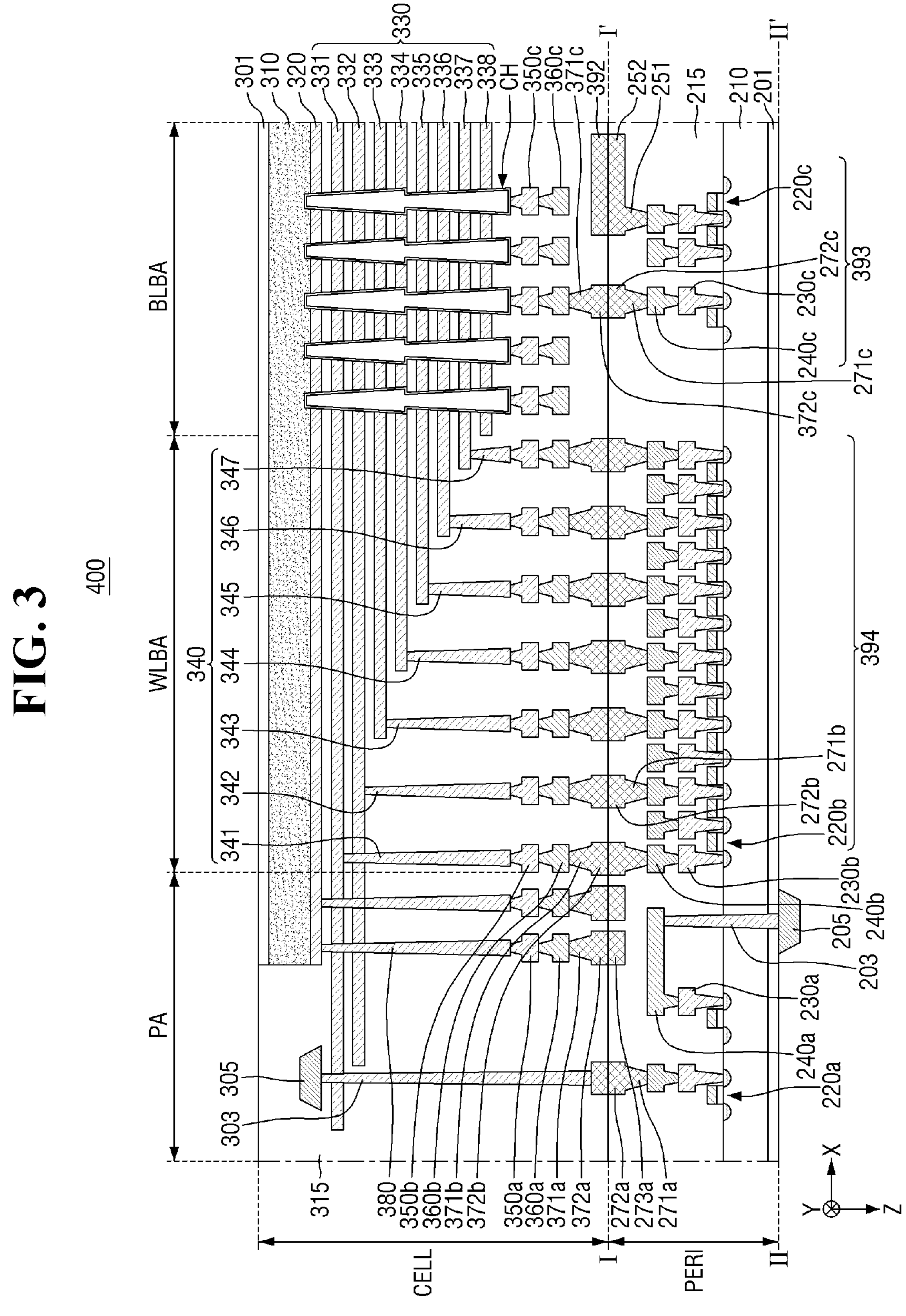
FIG. 3 is a diagram of an example nonvolatile memory device according to an example embodiment.

FIG. 3 is a diagram of an example nonvolatile memory device according to an example embodiment.

Referring to FIG. 3, a nonvolatile memory device 400 according to example embodiments may have a chip-to-chip (C2C) structure. The C2C structure may refer to a fabrication composed of an upper chip formed to include a cell region CELL on a first wafer, a lower chip formed to include a peripheral circuit region PERI on a second wafer different from the first wafer, and a subsequent interconnection between the upper chip and the lower chip by a bonding method.

For example, the bonding method may refer to a method of electrically connecting a bonding metal formed in the uppermost metal layer of the upper chip with a bonding metal formed in the uppermost metal layer of the lower chip. For example, when the bonding metal is formed of copper (Cu), the bonding method may be a Cu—Cu bonding method, and the bonding metal may be formed of aluminum or tungsten.

The peripheral circuit region PERI and the cell region CELL of the nonvolatile memory device 400 may each include an external pad bonding area PA, a word line bonding area WLBA, and a bit line bonding area BLBA.

The peripheral circuit region PERI may include a first substrate 210, an interlayer insulating layer 215, multiple circuit elements 220*a*, 220*b*, 220*c* formed on the first substrate 210, first metal layers 230*a*, 230*b*, 230*c* connected to the multiple circuit elements 220*a*, 220*b*, 220*c*, respectively, and second metal layers 240*a*, 240*b*, 240*c* formed on the first metal layers 230*a*, 230*b*, 230*c*. In at least one example embodiment, the first metal layers 230*a*, 230*b*, 230*c* may be formed of tungsten having a relatively high resistance, and the second metal layers 240*a*, 240*b*, 240*c* may be formed of copper having a relatively low resistance.

The first metal layers 230*a*, 230*b*, 230*c*, and the second metal layers 240*a*, 240*b*, 240*c* are illustrated, although the disclosure is not limited thereto. It may further include one or more metal layers formed on the second metal layers 240*a*, 240*b*, 240*c*. At least some of the one or more metal layers formed on the second metal layers 240*a*, 240*b*, and 240*c* may be formed of aluminum having a lower resistance than copper forming the second metal layers 240*a*, 240*b*, 240*c*.

The interlayer insulating layer 215 is disposed on the first substrate 210 to cover the circuit elements 220*a*, 220*b*, 220*c*, the first metal layers 230*a*, 230*b*, 230*c*, and the second metal layers 240*a*, 240*b*, 240*c*, and it may include an insulating material such as silicon oxide or silicon nitride.

The second metal layer 240*b* in the word line bonding area WLBA may be formed with lower bonding metals 271*b* and 272*b*. In the word line bonding area WLBA, the lower bonding metals 271*b* and 272*b* of the peripheral circuit region PERI may be electrically connected with the cell region CELL at its upper bonding metals 371*b* and 372*b* by a bonding method. The lower bonding metals 271*b*, 272*b* and the upper bonding metals 371*b*, 372*b* may be formed of aluminum, copper, tungsten, or the like.

The cell region CELL may provide at least one memory block. The cell region CELL may include a second substrate 310 and a common source line 320. On the second substrate 310, a plurality of word lines 331-338 (collectively 330) may be stacked in a direction (Z-axis direction) perpendicular to the top surface of the second substrate 310. Above and below the word lines 330, respectively, string selection lines and ground selection lines may be disposed. Between the string selection lines and the ground selection line, a plurality of word lines 330 may be disposed.

In the bit line bonding area BLBA, channel structures CH may be provided corresponding to the channel structures CS of FIG. 2. In the bit line bonding area BLBA, the channel structures CH may extend in a direction perpendicular to the top surface of the second substrate 310 to pass through the word lines 330, the string selection lines, and the ground selection line. The channel structures CH may each include a data storage layer, a channel layer, an embedded insulating layer, and the like, wherein the channel layer may be electrically connected to a first metal layer 350*c* and a second metal layer 360*c*. For example, the first metal layer 350*c* may be a bit line contact, and the second metal layer 360*c* may be a bit line. In at least one example embodiment, the bit line 360*c* may extend in a first direction (Y-axis direction) parallel to the top surface of the second substrate 310.

In the example embodiment shown in FIG. 3, a region in which the channel structures CH and the bit lines 360*c* are disposed may be defined as the bit line bonding area BLBA. The bit line 360*c* may be electrically connected in the bit line bonding area BLBA to the circuit elements 220*c* that provide the peripheral circuit region PERI with a page buffer 393. For example, the bit line 360*c* may be connected in the peripheral circuit region PERI to the upper bonding metals 371*c* and 372*c* which are connected to the lower bonding metals 271*c* and 272*c* that are connected to the circuit elements 220*c* of the page buffer 393.

In the word line bonding area WLBA, the word lines 330 may extend in a second direction (X-axis direction) parallel to the top surface of the second substrate 310, and they may be connected with a plurality of cell contact plugs 341-347 (collectively 340). The word lines 330 and the cell contact plugs 340 may be interconnected at such pads that are provided by at least some of the word lines 330 extending in different lengths along the second direction. On the cell contact plugs 340 that are in connection with the word lines 330, a first metal layer 350*b* and a second metal layer 360*b* may be connected in order. The cell contact plugs 340 may be connected in the word line bonding area WLBA to the peripheral circuit region PERI through upper bonding metals 371*b*, 372*b* in the cell region CELL and lower bonding metals 271*b*, 272*b* in the peripheral circuit region PERI.

The cell contact plugs 340 may be electrically connected in the peripheral circuit region PERI to the circuit elements 220*b* that provide a row decoder 394. In at least one example embodiment, the operating voltages of the circuit elements 220*b* providing the row decoder 394 may be different from those of the circuit elements 220*c* providing the page buffer 393. For example, the operating voltages of the circuit elements 220*c* providing the page buffer 393 may be greater than those of the circuit elements 220*b* providing the row decoder 394.

In the external pad bonding area PA, a common source line contact plug 380 may be disposed. The common source line contact plug 380 may correspond to the common source line contact 1 described with reference to FIG. 2. The common source line contact plug 380 may be formed of a metal, a metal compound, or a conductive material such as polysilicon, and it may be electrically connected to the common source line 320. On the common source line contact plug 380, a first metal layer 350*a* and a second metal layer 360*a* may be stacked in order. For example, a region in which the common source line contact plug 380, the first metal layer 350*a*, and the second metal layer 360*a* are disposed may be defined as the external pad bonding area PA.

The external pad bonding area PA may include input/output pads 205 and 305 disposed therein. Referring to FIG. 3, the first substrate 210 may have its lower surface formed and covered with a lower insulating layer 201, on which a first input/output pad 205 is formed. The first input/output pad 205 may be connected through a first input/output contact plug 203 to at least one of the circuit elements 220*a*, 220*b*, 220*c* disposed in the peripheral circuit region PERI through the first input/output contact plug 203, and it may be isolated from the first substrate 210 by the lower insulating layer 201. Additionally, a side insulating layer may be disposed and electrically separate between the first input/output contact plug 203 and the first substrate 210.

Referring to FIG. 3, the second substrate 310 may have its upper surface formed and covered with an upper insulating layer 301, and a second input/output pad 305 may be provided spaced apart from the upper insulating layer 301 in the x-axis direction. The second input/output pad 305 may be connected through a second input/output contact plug 303 to at least one of the circuit elements 220$a$, 220$b$, and 220$c$ disposed in the peripheral circuit region PERI. The second input/output pad 305 may correspond to the input/output metal contact IOMC described with reference to FIG. 2.

In example embodiments, the region including the second input/output contact plug 303 may be void of the second substrate 310, the common source line 320, and others. Referring to FIG. 3, the second input/output contact plug 303 is separated from the second substrate 310 in a direction parallel to the upper surface of the second substrate 310, and it may be connected through an interlayer insulating layer 315 in the cell region CELL may be connected to the second input/output pad 305.

In the nonvolatile memory device 400 according to example embodiments, the second input/output contact plug 303, the common source line contact plug 380, and the plurality of cell contact plugs 341-347 or 340 may be formed simultaneously. This may improve the manufacturing process efficiency of the nonvolatile memory device 1.

Additionally, in the nonvolatile memory device 400 according to example embodiments, the common source line contact plug 380 is in contact with the common source line 320 by a first contact surface, and the second input/output contact plug 303 is in contact with the second input/output pad 305 by a second contact surface that may be equal in elevation to the first contact surface.

Further, a first length in the Z direction of the common source line contact plug 380 may be the same as a second length in the Z direction of the second input/output contact plug 303.

In each of the external pad bonding area PA and the bit line bonding area BLBA included respectively in the cell region CELL and the peripheral circuit region PERI, the uppermost metal layer may have a metal pattern in the form of a dummy pattern, or the uppermost metal layer may be absent.

In the external pad bonding area PA of the nonvolatile memory device 400, the cell region CELL may have its uppermost metal layer formed with an upper metal pattern 372$a$, conforming to which, the peripheral circuit region PERI may have its uppermost metal layer formed with a lower metal pattern 276$a$ having the same shape as the upper metal pattern 372$a$ in the cell region CELL. The lower metal pattern 276$a$ formed on the uppermost metal layer of the peripheral circuit region PERI may not be connected to a separate contact in the peripheral circuit region PERI. Similarly, in the external pad bonding area PA, the peripheral circuit region PERI may have its uppermost metal layer formed with a lower metal pattern, conforming to which, the cell region CELL may have its upper metal layer formed with an upper metal pattern having the same shape as the lower metal pattern in the peripheral circuit region PERI.

On the second metal layer 240$b$ in the word line bonding area WLBA, the lower bonding metals 271$b$ and 272$b$ may be formed. In the word line bonding area WLBA, the lower bonding metals 271$b$ and 272$b$ in the peripheral circuit region PERI may be electrically connected with the upper bonding metals 371$b$ and 372$b$ in the cell region CELL by a bonding method.

Additionally, in the bit line bonding area BLBA, the peripheral circuit region PERI may have its uppermost metal layer formed with a lower metal pattern 252, conforming to which, the cell region CELL may have its uppermost metal layer formed with an upper metal pattern 392 having the same shape as the lower metal pattern 252 in the peripheral circuit region PERI. No contact may be formed on the upper metal pattern 392 formed on the uppermost metal layer in the cell region CELL.

As described above in FIG. 3, by forming the second input/output contact plug 303 of the nonvolatile memory device 1 according to example embodiments in each of the extension regions, the limited space of the nonvolatile memory device 1 can be used efficiently. Additionally, the forming of the second input/output contact plug 303 of the nonvolatile memory device 1 according to example embodiments in each of the extension regions can also reduce the size of a final chip product including the nonvolatile memory device 1.

Additionally, as described above in FIG. 3, by forming the common source line contact plug 380 of the nonvolatile memory device 1 according to example embodiments in each of the extension regions, the limited space of the nonvolatile memory device 1 can be used efficiently. Additionally, the forming of the common source line contact plug 380 of the nonvolatile memory device 1 according to example embodiments in each of the extension regions can also reduce the size of a final chip product including the nonvolatile memory device 1.

An insulating material may be formed along the inner surfaces of the second input/output contact plug 303 and the common source line contact plug 380. Additionally, the second input/output contact plug 303 and the common source line contact plug 380 may include a conductive material in the insulating material formed along the inner surfaces thereof. The conductive material may be, for example, tungsten.

Figure 4:
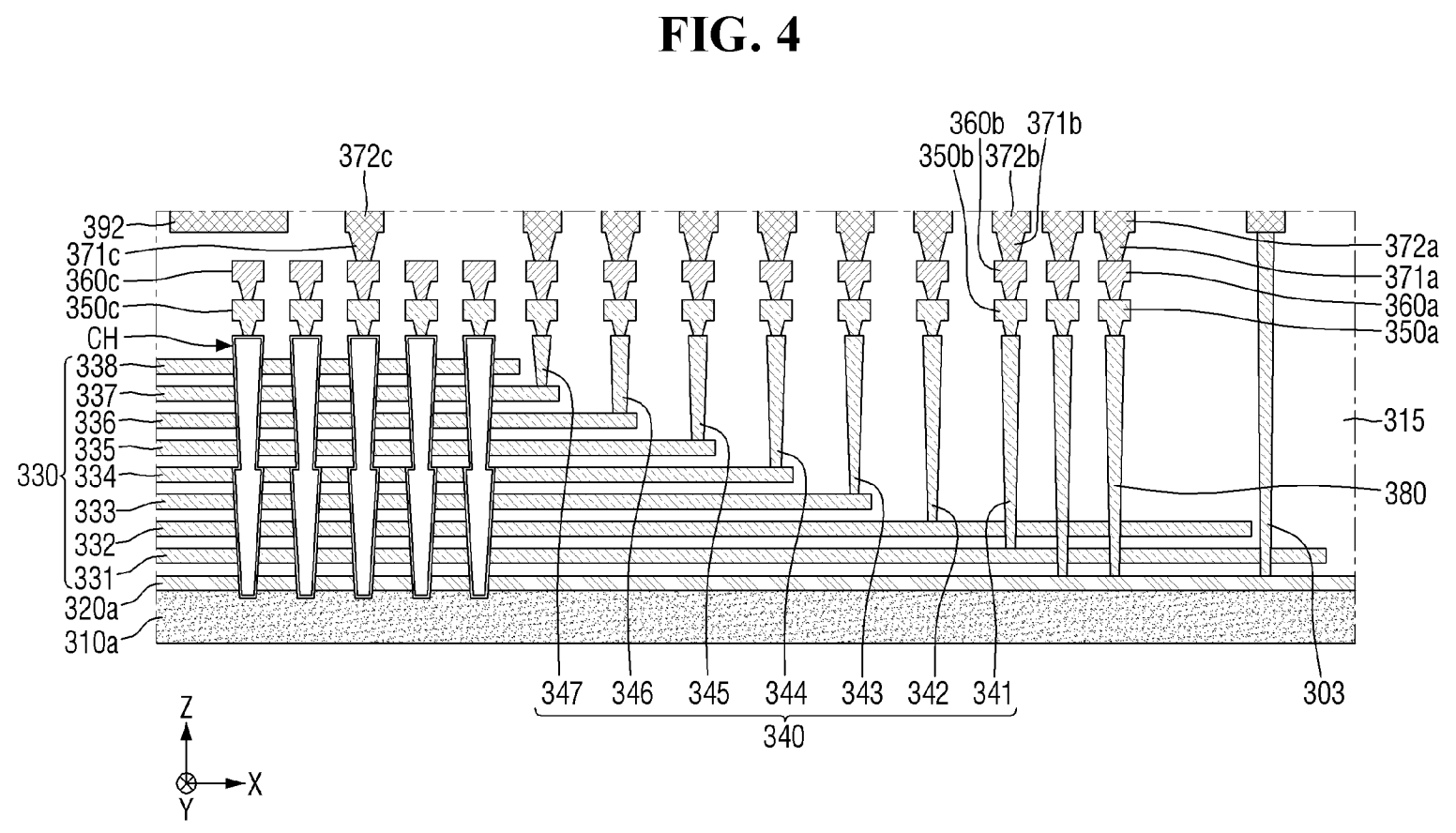
Figure 5:
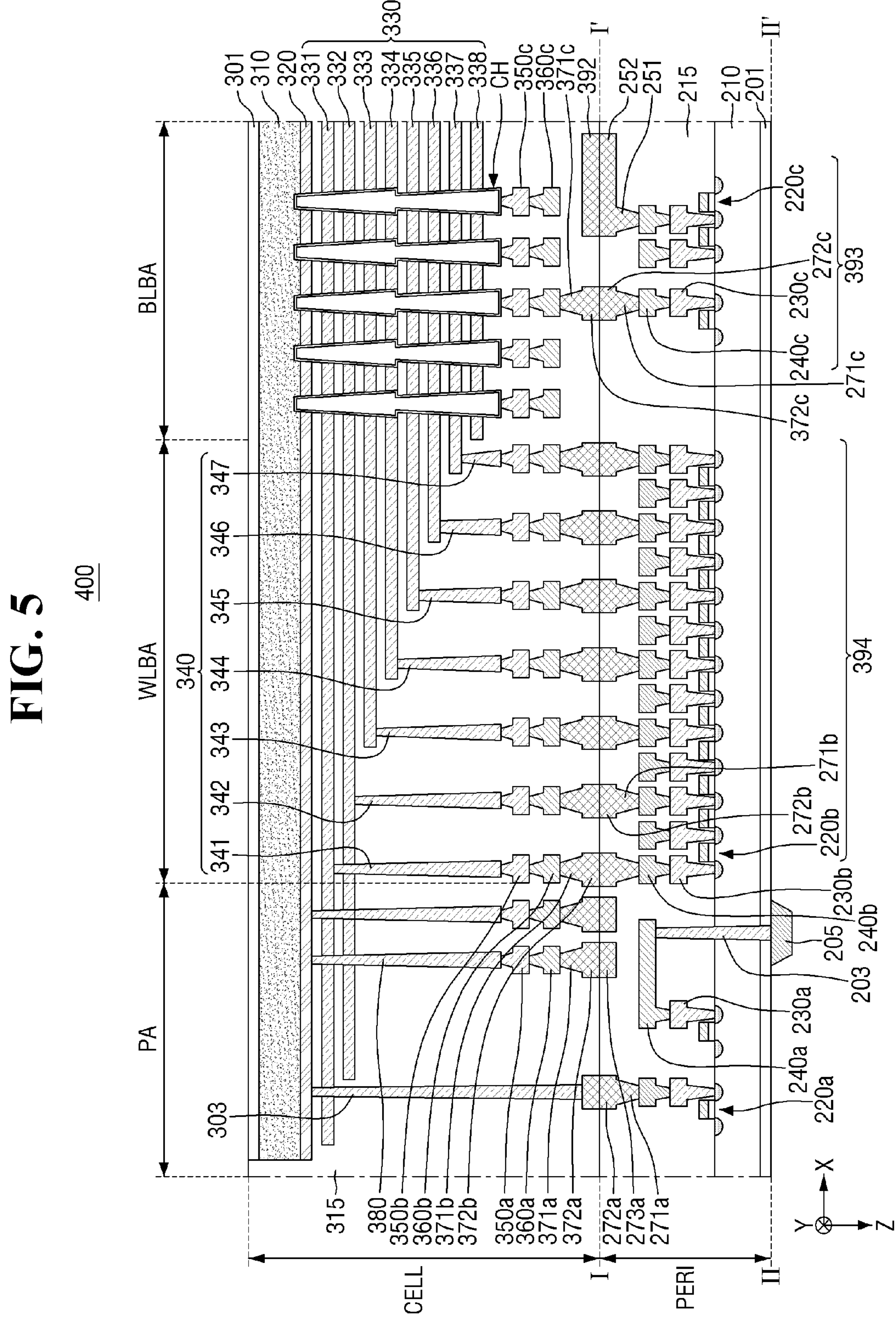

FIGS. 4 and 5 are diagrams of intermediate steps of manufacturing the nonvolatile memory device 400 of FIG. 3 according to an example embodiment. With respect to the drawings, repetitive descriptions of those aforementioned will be omitted for brevity.

Referring to FIG. 4, a nonvolatile memory device according to example embodiments may be formed on a temporary substrate 310$a$ and an undoped poly substrate 320$a$. At this time, simultaneously (or substantially simultaneously) formed may be one or more second input/output contact plugs 303, a common source line contact plug 380, and multiple cell contact plugs 341-347 or 340. This may improve the manufacturing process efficiency of the nonvolatile memory device 1.

Referring to FIG. 5, the cell region CELL is joined with the peripheral circuit region PERI. The temporary substrate 310$a$ and the undoped poly substrate 320$a$ in FIG. 4 are removed, and sequentially formed are a common source line 320, a second substrate 310, and an upper insulating layer 301.

Thereafter, to form a second input/output pad 305 connected as in FIG. 3 to the second input/output contact plug 303, the common source line 320, the second substrate 310, and the upper insulating layer 301 are removed from above the second input/output contact plug 303, and the second input/output pad 305 is formed to manufacture the nonvolatile memory device 400 of FIG. 3.

Figure 6:
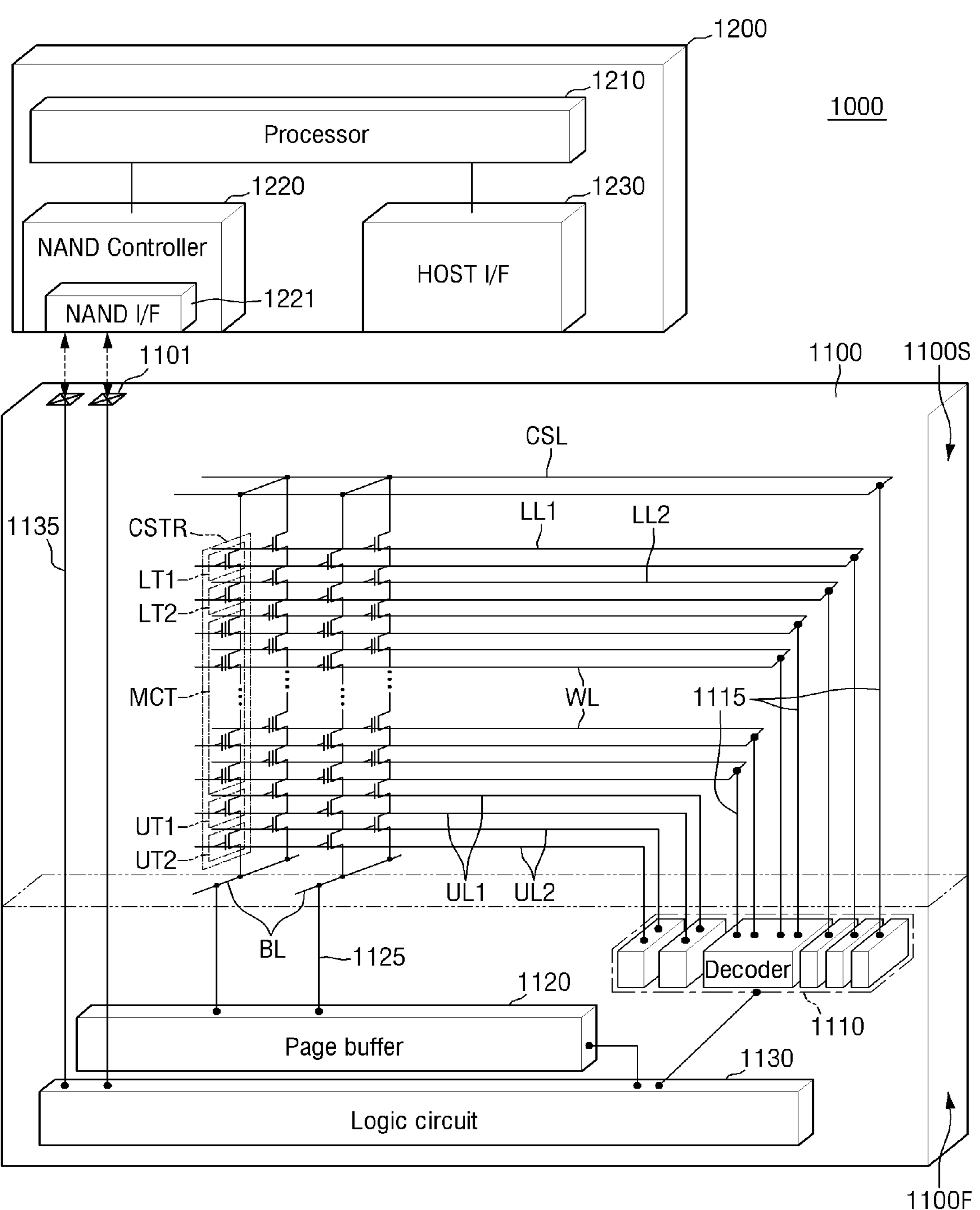
FIG. 6 is a diagram of an example nonvolatile memory system including a nonvolatile memory device according to an example embodiment.

FIG. 6 is a diagram of an example nonvolatile memory system 1000 including a nonvolatile memory device 1100 according to an example embodiment.

Referring to FIG. 6, the nonvolatile memory system 1000 according to an example embodiment of the present disclosure may include a nonvolatile memory device 1100 similar to those described above with reference to FIGS. 1 to 5 and a controller 1200 electrically connected to the nonvolatile memory device 1100. The nonvolatile memory system 1000 may be a storage device including one or multiple nonvolatile memory devices 1100, or it may be an electronic device including a storage device. For example, the nonvolatile memory system 1000 may be one including one or more nonvolatile memory devices 1100, such as a solid state drive device (SSD), a universal serial bus (USB), a computing system, a medical device, or a communication device.

The nonvolatile memory device 1100 may be, for example, the NAND flash memory device described above with reference to FIGS. 1 to 5. The nonvolatile memory device 1100 may include a first structure 1100F and a second structure 1100S on the first structure 1100F. The first structure 1100F may be a peripheral circuit structure including a decoder circuit 1110, a page buffer 1120, and a logic circuit 1130. The second structure 1100S may be a memory cell structure including bit lines BL, a common source line CSL, word lines WL, first and second gate upper lines UL1 and UL2, first and second gate lower lines LL1 and LL2, and memory cell strings CSTR between the bit lines BL and the common source line CSL.

In the second structure 1100S, the memory cell strings CSTR may each include lower transistors LT1 and LT2 adjacent to the common source line CSL, upper transistors UT1, UT2 adjacent to the bit line BL, and a plurality of memory cell transistors MCT disposed between the lower transistors LT1 and LT2 and the upper transistors UT1 and UT2. The number of lower transistors and the number of upper transistors are subject to variation according to example embodiments.

In example embodiments, the upper transistors UT1 and UT2 may include a string selection transistor, and the lower transistors LT1 and LT2 may include a ground selection transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

The common source line CSL, the first and second gate lower lines LL1 and LL2, the word lines WL, and the first and second gate upper lines UL1 and UL2 may be electrically connected to the decoder circuit 1110 through first interconnection lines 1115 extending from within the first structure 1100F to the second structure 1100S. The bit lines BL may be electrically connected to the page buffer 1120 through second interconnection lines 1125 extending from within the first structure 1100F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1000 may communicate with the controller 1200 through input/output pads 1101 electrically connected to the logic circuit 1130. The input/output pads 1101 may be electrically connected to the logic circuit 1130 through input/output connection lines 1135 extending from within the first structure 1100F to the second structure 1100S.

The controller 1200 may include a processor 1210, a NAND controller 1220, and a host interface 1230. In example embodiments, the nonvolatile memory system 1000 may include multiples of the nonvolatile memory device 1100, where the controller 1200 may control the multiple nonvolatile memory devices 1100.

The processor 1210 may control the operation of the nonvolatile memory system 1000 overall, including the controller 1200. The processor 1210 may operate according to predetermined firmware, and it may access the nonvolatile memory device 1100 by controlling the NAND controller 1220. The NAND controller 1220 may include a NAND interface 1221 that handles communications with the nonvolatile memory device 1100. The NAND interface 1221 may be used to transmit, among others, a control command for controlling the nonvolatile memory device 1100, data to be written to the memory cell transistors MCT of the nonvolatile memory device 1100, and data to be read from the memory cell transistors MCT of the nonvolatile memory device 1100. The host interface 1230 may provide a communication function between the nonvolatile memory system 1000 and an external host. Upon receiving a control command from an external host through the host interface 1230, the processor 1210 may control the nonvolatile memory device 1100 in response to the control command.

Figure 7:
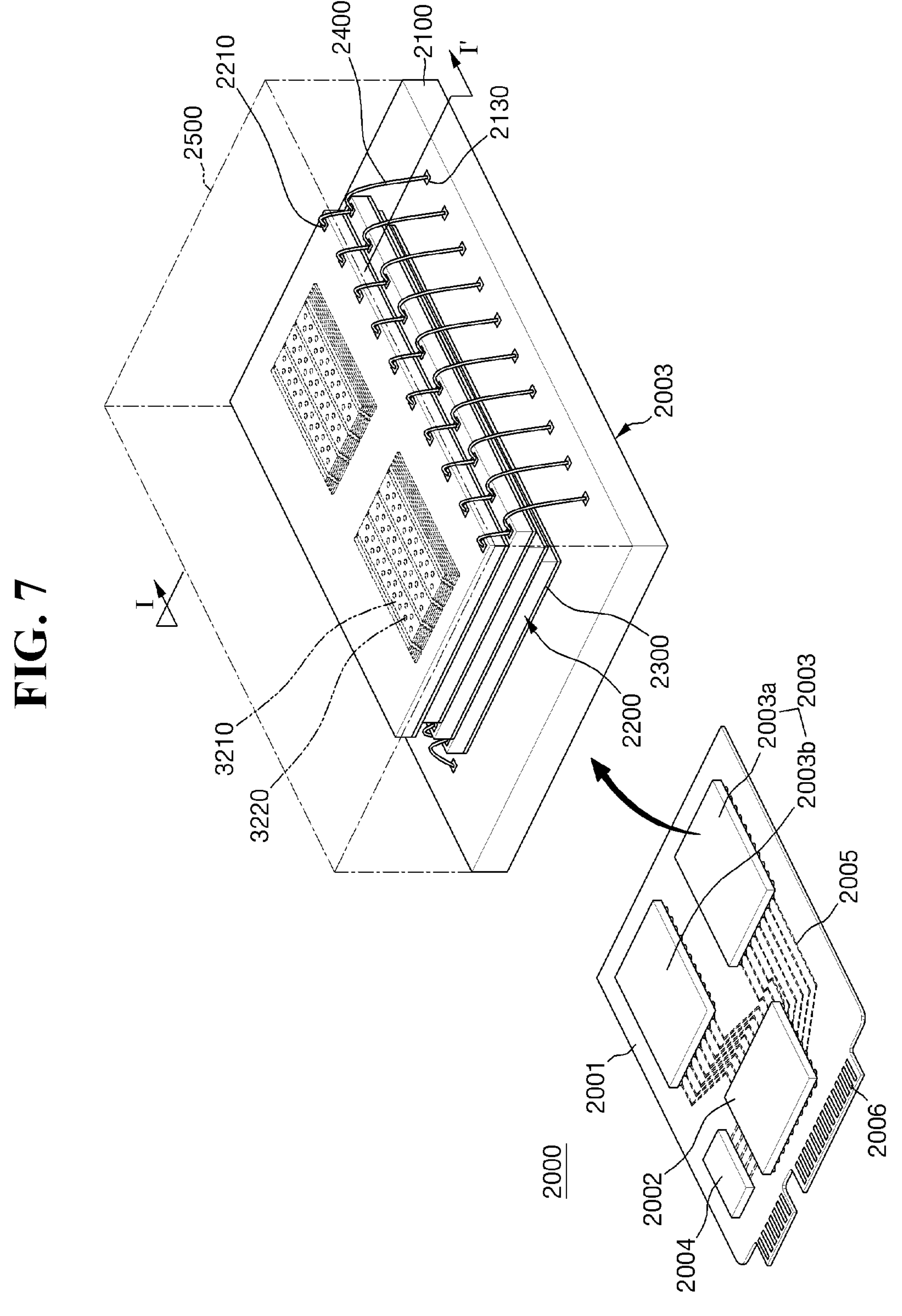
FIG. 7 is a diagram of an example nonvolatile memory system including nonvolatile memory devices according to an example embodiment.

FIG. 7 is a diagram of an example nonvolatile memory system 2000 including nonvolatile memory devices according to an example embodiment.

Referring to FIG. 7, the nonvolatile memory system 2000 according to at least one example embodiment of the present disclosure may include a mainboard 2001, a controller 2002 mounted on the mainboard 2001, one or more semiconductor packages 2003, and a dynamic random access memory (DRAM) 2004. The semiconductor packages 2003 and the DRAM 2004 may be connected with the controller 2002 by wiring patterns 2005 formed on the mainboard 2001.

The mainboard 2001 may include a connector 2006 including a plurality of pins coupled to an external host. The number and arrangement of the pins in the connector 2006 may vary according to a communication interface between the nonvolatile memory system 2000 and the external host. In example embodiments, the nonvolatile memory system 2000 may communicate with an external host according to any one of the interfaces including USB, peripheral component interconnect express (PCI-Express), serial advanced technology attachment (SATA), and an M-Phy for universal flash storage (UFS). In example embodiments, the nonvolatile memory system 2000 may operate by power supplied from an external host through the connector 2006. The nonvolatile memory system 2000 may further include a power management integrated circuit (PMIC) for distributing power supplied from the external host to the controller 2002 and the semiconductor packages 2003.

The controller 2002 may write data to or read data from the semiconductor packages 2003, and it can improve the operating speed of the nonvolatile memory system 2000.

The DRAM 2004 may be a buffer memory for mitigating a speed difference between the semiconductor packages 2003, which is a data storage space, and an external host. The DRAM 2004 included in the nonvolatile memory system 2000 may operate as a kind of cache memory, and it may also provide a space for temporarily storing data in a control operation on the semiconductor packages 2003. When the DRAM 2004 is included in the nonvolatile memory system 2000, the controller 2002 may include a DRAM controller for controlling the DRAM 2004 in addition to the NAND controller for controlling the semiconductor packages 2003.

The semiconductor packages 2003 may include first and second semiconductor packages 2003*a* and 2003*b* spaced apart from each other. The first and second semiconductor packages 2003*a* and 2003*b* may each be a semiconductor package including a plurality of semiconductor chips 2200.

The first and second semiconductor packages 2003*a* and 2003*b* may each include a package substrate 2100, the semiconductor chips 2200 on the package substrate 2100, and adhesive layers 2300 disposed on lower surfaces of the semiconductor chips 2200, respectively, connection structures 2400 for electrically connecting the semiconductor chips 2200 and the package substrate 2100, and a molding layer 2500 for covering the semiconductor chips 2200 and the connection structures 2400 on the package substrate 2100.

The package substrate 2100 may be a printed circuit board including package upper pads 2130. Each semiconductor chip 2200 may include input/output pads 2210. The input/output pads 2210 may correspond to the input/output pads 1101 in FIG. 6. The semiconductor chips 2200 may each include metal lines 3210 and channel structures 3220. The semiconductor chips 2200 may each include those nonvolatile memory devices as described above with reference to FIGS. 1 to 5.

In example embodiments, the connection structures 2400 may be bonding wires for electrically connecting the input/output pads 2210 with the package upper pads 2130. Accordingly, in each of the first and second semiconductor packages 2003*a* and 2003*b*, the semiconductor chips 2200 may be electrically connected by a bonding wire method, and they may be electrically connected to the package upper pads 2130 of the package substrate 2100. According to example embodiments, in each of the first and second semiconductor packages 2003*a* and 2003*b*, the semiconductor chips 2200 may be electrically connected by other connection structures including through silicon vias (TSVs) than the bonding wire-type connection structure 2400.

In example embodiments, the controller 2002 and the semiconductor chips 2200 may be included in one package. In an example embodiment, the controller 2002 and the semiconductor chips 2200 may be mounted on a separate interposer substrate different from the main substrate 2001, and wiring formed on the interposer substrate may interconnect the controller 2002 and the semiconductor chips 2200.

Figure 8:
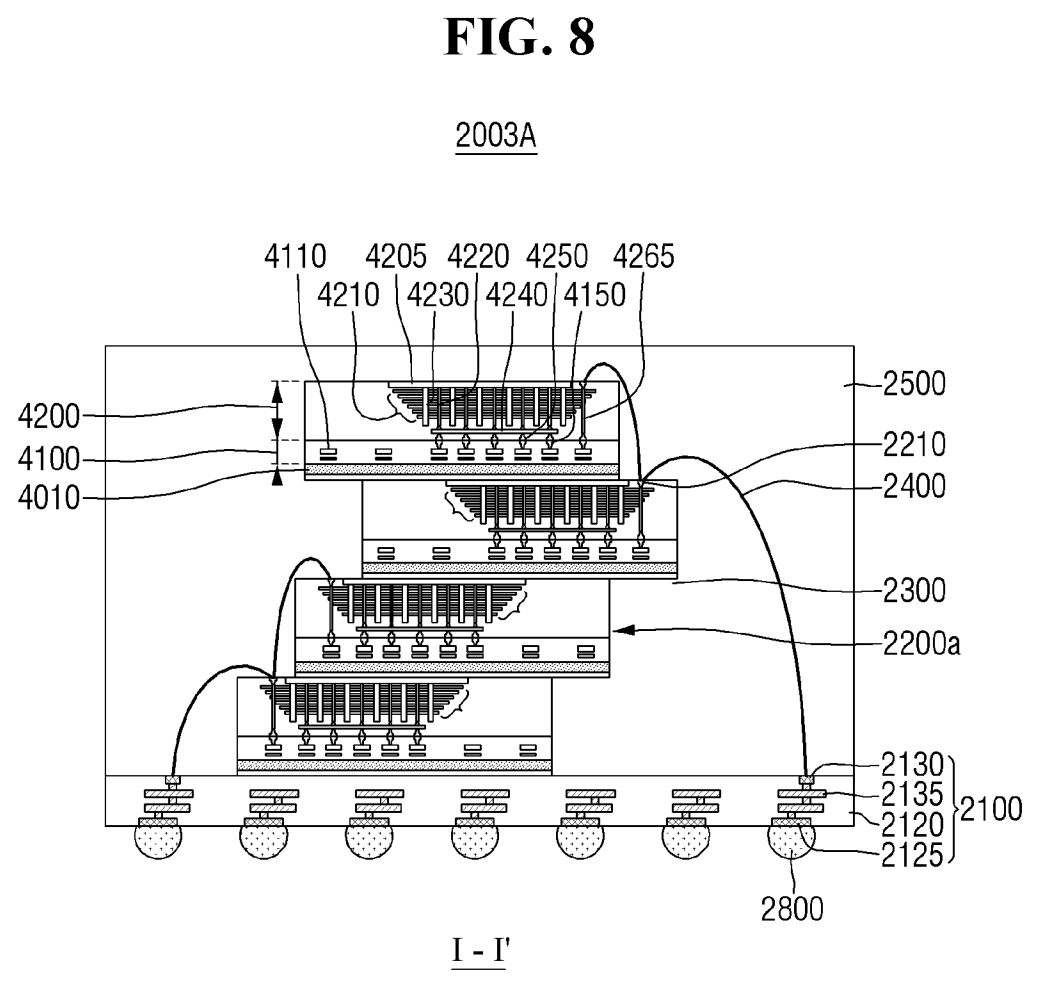
Figure 9:
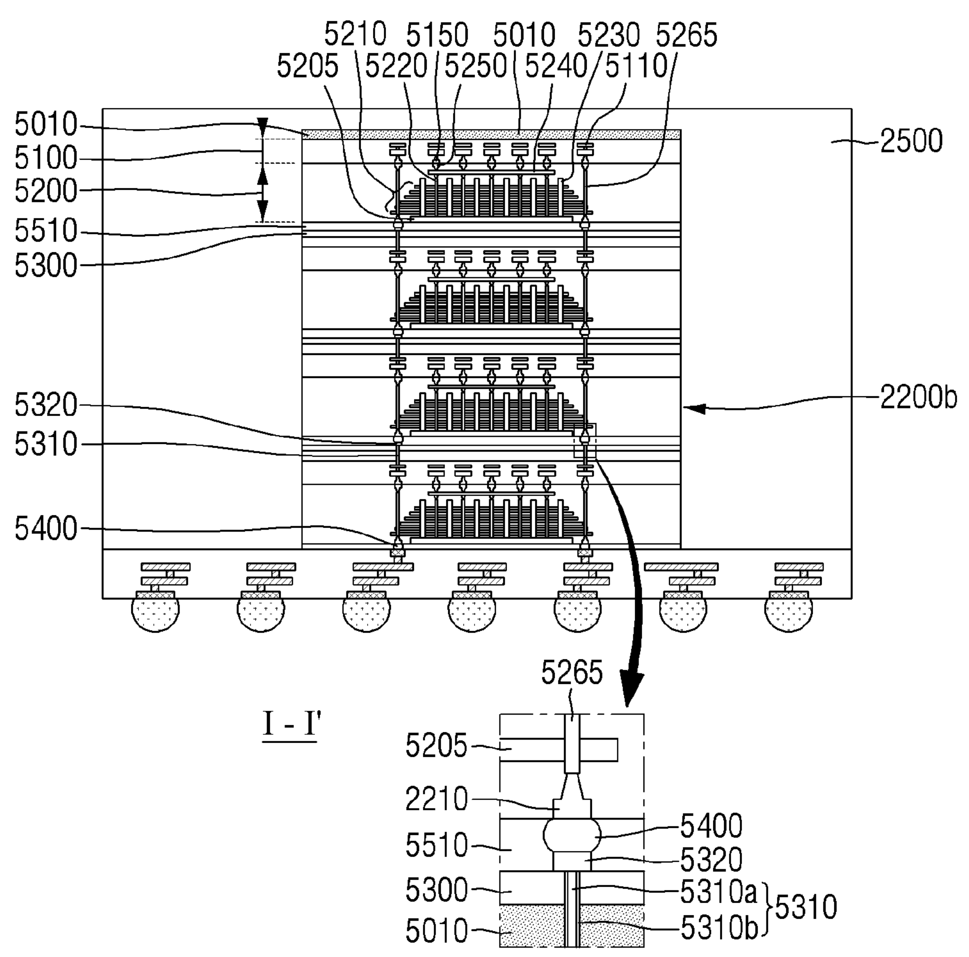

FIGS. 8 and 9 are cross-sectional views taken along line I-I' of a nonvolatile memory package 2003 of FIG. 7 including the nonvolatile memory device according to an example embodiment.

Referring to FIG. 8, in a semiconductor package 2003A, semiconductor chips 2200*a* may be provided each including a semiconductor substrate 4010, a first structure 4100 on the semiconductor substrate 4010, and a second structure 4200 disposed on and bonded to the first structure 4100 by a wafer bonding method.

The first structure 4100 may include a peripheral circuit region including peripheral lines 4110 and first bonding structures 4150. The second structure 4200 may include a common source line 4205, metal lines 4210 between the common source line 4205 and the first structure 4100, channel structures 4220 and isolation structures 4230 passing through the metal lines 4210, and second bonding structures 4250 electrically connected to the channel structures 4220 and word lines (e.g., WLs in FIG. 6) of the metal lines 4210, respectively. For example, the second bonding structures 4250 may be electrically connected to the channel structures 4220 and the word lines (e.g., WLs in FIG. 6) respectively through bit lines 4240 that are in electrical connection with the channel structures 4220 and through gate interconnection lines that are in electrical connection with the word lines (e.g., WLs in FIG. 6). The first bonding structures 4150 of the first structure 4100 and the second bonding structures 4250 of the second structure 4200 may be bonded together while being in contact with each other. Bonded portions of the first bonding structures 4150 and the second bonding structures 4250 may be formed of, for example, copper (Cu).

As described above with reference to FIGS. 1 to 5, the input/output connection lines 4265 may be formed in an extension region that is a partial region of the metal lines 4210, thereby reducing the size of the semiconductor package 2003A that includes those nonvolatile memory devices according to example embodiments.

Referring to FIG. 9, in a semiconductor package 2003B, semiconductor chips 2200*b* may be provided to be vertically aligned with each other. The semiconductor chips 2200*b* may each include a semiconductor substrate 5010, a first structure 5100 formed under the semiconductor substrate 5010, and a second structure 5200 disposed under and bonded to the first structure 5100 by a wafer bonding method.

The first structure 5100 may include a peripheral circuit region including peripheral lines 5110 and first bonding structures 5150. The second structure 5200 may include a common source line 5205, a gate stacked structure 5210 between the common source line 5205 and the first structure 5100, memory channel structures 5220 and isolation structure 5230 passing through the gate stacked structure 5210, and second bonding structures 5250 electrically connected to the memory channel structures 5220 and word lines (e.g., WLs in FIG. 6) of the gate stacked structure 5210, respectively. For example, the second bonding structures 5250 may be electrically connected to the memory channel structures 5220 and the word lines (e.g., WLs in FIG. 6) through bit lines 5240 that are in electrical connection with the memory channel structures 5220 and through gate interconnection lines that are in electrical connection with the word lines (WLs in FIG. 6). The first bonding structures 5150 of the first structure 5100 and the second bonding structures 5250 of the second structure 5200 may be bonded together while being in contact with each other. Bonded portions of the first bonding structures 5150 and the second bonding structures 5250 may be formed of, for example, copper (Cu).

Among the semiconductor chips 2200*b*, the remaining semiconductor chips except for the uppermost semiconductor chip may each further include a rear insulating layer 5300 on the semiconductor substrate 5010, rear input/output pads 5320 on the rear insulating layer 5300, and TSV structures 5310 that penetrate the semiconductor substrate 5010 and the rear insulating layer 5300 and electrically connect the peripheral lines 5110 of the first structure 5100 with the rear input/output pads 5320. The TSV structures 5310 may each include a TSV 5310*a* and an insulating spacer 5310*b* surrounding the side surfaces of the TSV 5310*a*. The semiconductor device 2003B may further include connection structures 5400, for example, conductive bumps disposed under the semiconductor chips 2200*b*, respectively. The connection structures 5400 may electrically connect the semiconductor chips 2200*b* to each other, and may electrically connect the semiconductor chips 2200*b* with the package substrate 2100. An underfill material layer 5510 may surround the side surfaces of the conductive bump 5400.

The semiconductor package 2003B that includes such nonvolatile memory devices according to example embodiments as described with reference to FIGS. 1 to 5 has the input/output connection lines 5265 formed in the extension region which is a partial region of the metal lines 5210, thereby reducing the size of the semiconductor package 2003A that includes those nonvolatile memory devices according to example embodiments.

Although example embodiments of the present disclosure have been described above with reference to the accompanying drawings, it will be understood by those of ordinary skill in the art that the present disclosure is not limited thereto and may be implemented in many different forms without departing from the disclosure or essential features thereof. Therefore, it should be understood that the embodiments set forth herein are merely examples in all respects and not restrictive.

What is claimed is:

1. A nonvolatile memory device, comprising:

a first substrate and a second substrate spaced apart from the first substrate in a first direction;

a plurality of metal lines stacked in the first direction;

a plurality of cell structures connected with a bit line, the plurality of cell structures extending in the first direction and passing through the plurality of metal lines;

a cell array region;

an extension region extending in a second direction perpendicular to the first direction, the extension region comprising a first section adjacent to a side of the cell array region in the second direction, and a second section adjacent to the first section in the second direction, the extension region having an entire length in a third direction perpendicular to the first direction and the second direction;

a plate common source line contact connected with a common source line, extending in the first direction, and formed in the first section of the extension region, wherein the first section does not include the plurality of cell structures; and input/output metal contacts connected with an external connection pad and extending between the first substrate and the second substrate in the first direction, wherein the second section does not include the plate common source line contact, wherein the input/output metal contacts comprise a first input/output contact plug in the first section of the extension region, and a second input/output contact plug disposed in the second section of the extension region, wherein, in the second direction the first substrate extends across the cell array region, the first section of the extension region, and the second section of the extension region, wherein, in the second direction, the second substrate extends across the cell array region and the first section of the extension region, and does not extend into the second section of the extension region, wherein the plate common source line contact is in contact with the common source line by a first contact surface, and wherein the second input/output contact plug is in contact with the external connection pad by a second contact surface that is at a same level in the first direction as the first contact surface.

2. The nonvolatile memory device of claim 1, wherein the plate common source line contact and the second input/output contact plug extend to a same level in the first direction.

3. The nonvolatile memory device of claim 1, wherein the plate common source line contact and the second input/output contact plug are simultaneously formed.

4. The nonvolatile memory device of claim 1, wherein the plate common source line contact comprises an insulating material on an inner surface thereof.

5. The nonvolatile memory device of claim 4, wherein the plate common source line contact comprises a conductive material on an inner surface of the insulating material.

6. The nonvolatile memory device of claim 1, wherein the second input/output contact plug comprises an insulating material on inner surfaces thereof.

7. The nonvolatile memory device of claim 6, wherein the second input/output contact plug comprises a conductive material on an inner surface of the insulating material.

8. A nonvolatile memory device, comprising:

a first substrate and a second substrate spaced apart from the first substrate in a first second direction;

a plurality of metal lines extending in a first direction and stacked in a in the second direction crossing the first direction;

a plurality of cell structures passing through the plurality of metal lines and extending in the second direction;

a cell array region;

an extension region extending in the first direction, the extension region comprising a first section adjacent to a side of the cell array region in the first direction, and a second section adjacent to the first section in the first direction, the extension region having an entire length in a third direction perpendicular to the first direction and the second direction;

a plate common source line contact spaced apart from the plurality of cell structures in the first direction, extending in the second direction, formed in the first section of the extension region, and connected with a common source line, wherein the first section does not include the plurality of cell structures; and input/output metal contacts spaced apart from the plate common source line contact in the first direction, extending between the first substrate and the second substrate in the second direction, and connected with an external connection pad, wherein the second section does not include the plate common source line contact, wherein the input/output metal contacts comprise a first input/output contact plug in the first section of the extension region, and a second input/output contact plug disposed in the second section of the extension region, wherein, in the second direction the first substrate extends across the cell array region, the first section of the extension region, and the second section of the extension region, wherein, in the second direction, the second substrate extends across the cell array region and the first section of the extension region, and does not extend into the second section of the extension region, wherein the plate common source line contact is in contact with the common source line by a first contact surface, and wherein the second input/output contact plug is in contact with the external connection pad by a second contact surface that is at a same level in the second direction as the first contact surface.

9. The nonvolatile memory device of claim 8, wherein the plate common source line contact and the second input/output contact plug extend to a same level in the second direction.

10. The nonvolatile memory device of claim 8, wherein the plate common source line contact and the second input/output contact plug are simultaneously formed.

11. The nonvolatile memory device of claim 8, wherein the plate common source line contact comprises an insulating material on an inner surface thereof.

12. The nonvolatile memory device of claim 11, wherein the plate common source line contact comprises a conductive material on an inner surface of the insulating material.

13. The nonvolatile memory device of claim 8, wherein the second input/output contact plug comprises an insulating material on inner surfaces thereof.

14. The nonvolatile memory device of claim 13, wherein the second input/output contact plug comprises a conductive material on an inner surface of the insulating material.

15. A nonvolatile memory system, comprising:

a nonvolatile memory device configured to store data and comprising an external connection pad; and a controller configured to control the nonvolatile memory device through the external connection pad, wherein the nonvolatile memory device further comprises:

a first substrate and a second substrate spaced apart from the first substrate in a second direction, a plurality of metal lines extending in a first direction and stacked in the second direction crossing the first direction, a plurality of cell structures passing through the plurality of metal lines and extending in the second direction, a cell array region;

an extension region extending in the first direction, the extension region comprising a first section adjacent to a side of the cell array region in the first direction, and a second section adjacent to the first section in the first direction, the extension region having an entire length in a third direction perpendicular to the first direction and the second direction;

a plate common source line contact spaced apart from the plurality of cell structures in the first direction, extending in the second direction, formed in the first section of the extension region, and connected with a common source line, wherein the first section does not include the plurality of cell structures; and input/output metal contacts spaced apart from the plate common source line contact in the first direction, extending between the first substrate and the second substrate in the second direction, and connected with the external connection pad, wherein the second section does not include the plate common source line contact, and wherein the input/output metal contacts comprise a first input/output contact plug in the first section of the extension region, and a second input/output contact plug disposed in the second section of the extension region, wherein, in the second direction the first substrate extends across the cell array region, the first section of the extension region, and the second section of the extension region, wherein, in the second direction, the second substrate extends across the cell array region and the first section of the extension region, and does not extend into the second section of the extension region, wherein the plate common source line contact is in contact with the common source line by a first contact surface, and wherein the second input/output contact plug is in contact with the external connection pad by a second contact surface that is at a same level in the second direction as the first contact surface.

16. The nonvolatile memory system of claim 15, wherein the plate common source line contact and the second input/output contact plug each comprises an insulating material on an inner surface thereof, and a conductive material on an inner surface of the insulating material.

17. The nonvolatile memory system of claim 15, wherein the plate common source line contact and the second input/output contact plug are simultaneously formed.

* * * * *